United States Patent
Ikeda et al.

(10) Patent No.: US 6,668,351 B1
(45) Date of Patent: Dec. 23, 2003

(54) DECODER AND DECODING METHOD

(75) Inventors: Tamotsu Ikeda, Tokyo (JP); Toshiyuki Miyauchi, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/601,976
(22) PCT Filed: Dec. 14, 1999
(86) PCT No.: PCT/JP99/07007
§ 371 (c)(1),
(2), (4) Date: Aug. 10, 2000
(87) PCT Pub. No.: WO00/36756
PCT Pub. Date: Jun. 22, 2000

(51) Int. Cl.[7] .............................................. H03M 13/03
(52) U.S. Cl. ....................................... 714/786; 714/796
(58) Field of Search ................................ 714/786, 794, 714/796

(56) References Cited

U.S. PATENT DOCUMENTS 5,588,028 A * 12/1996 Parizhsky .................... 375/341

FOREIGN PATENT DOCUMENTS

| JP | 2-215232 | 8/1990 |
| JP | 7-254861 | 10/1995 |

OTHER PUBLICATIONS

Fumiaki Minematsu et al: "Tranmissions System for Multimedia Services in Satellite Broadcasting Channels" IEEE Transactions on Consumer Electronics, IEEE Inc. New York, US, vol. 44, No. 3, Aug. 1998, pp. 556–562, XP000851554 ISSN: 0098–3063.

Akinori Hashimoto et al: "Development of a Transmission System and an Integrated Receiver for Satellite ISDB" IEEE Transactions on Broadcast and TV Receivers, IEEE, New York, NY, US, Jun. 1997, pp. 337–343, XP002926083 ISSN: 0098–3063.

* cited by examiner

*Primary Examiner*—Phung M. Chung
(74) *Attorney, Agent, or Firm*—Frommer Lawrence & Haug LLP; William S. Frommer; Glenn F. Savit

(57) ABSTRACT

The deterioration of an error characteristic obtained at a point where a transfer method is changed is suppressed. A first adder calculates a SM value obtained when the state 00 is changed to the state 00, and outputs it to a comparator. A second adder calculates a SM value obtained when the state 01 is changed to the state 00, and outputs it to the comparator. The comparator compares the SM values, selects a path having the larger likelihood, and outputs to a register having a set and a reset. An ACS controller detects a condition in which the state transition of fixed information TAB1 is uniquely determined, and outputs a reset signal to the register having a set and a reset, which stores the SM value of that state, to set the value of the register to zero. The ACS controller 85 also outputs set signals to registers having sets and resets, which store the SM values of the states other than the state 00 of the fixed information TAB1, to set them to the maximum value.

10 Claims, 15 Drawing Sheets

DECODER AND DECODING METHOD

TECHNICAL FIELD

The present invention relates to a decoding apparatus and method, and more particularly, to a decoding apparatus and method which is capable of suppressing the decoding deterioration in transfer data when a transfer-data modulation method is changed.

BACKGROUND ART

In Japan, the Radio Regulatory Council submitted a report in which digital broadcasting service by the use of a broadcasting satellite (hereinafter called a BS) will be implemented by a BS4 satellite, which will be launched in the future. Data to be transferred includes main information formed of video signals and audio signals, a transfer method indicating a data encoding rate and a modulation method, a TMCC (transmission multiplexing configuration control) signal in which transport stream (TS) information in data is encoded, and fixed information formed of special-pattern data used for stopping propagation of a transfer-data error.

The main information is encoded and transferred by a QPSK (quadrature phase shift keying) modulation method at an encoding rate R of 1/2, 2/3, 3/4, 5/6, or 7/8, or at a TC8PSK (trelliscoded-coded 8 phase shift keying) method at an encoding rate R of 2/3. The TMCC signal and the fixed information are transferred via a BPSK (binary phase shift keying) signal encoded at an encoding rate of 1/2 (R=1/2). An encoding method and a decoding method used when basic modulation methods (TC8PSK, BPSK, and QPSK) are employed in a time-division manner in the above broadcasting method will be described below by referring to FIG. 5.

An information generator 1 converts the main information, the TMCC signal, and the fixed information, which are binary, to serial data. A serial-to-parallel converter 2 outputs serial data as it is when the serial data is modulated by the BPSK or QPSK modulation method, and converts serial data to two-bit parallel data and outputs it when the serial data is modulated by the TC8PSK modulation method.

An encoder 3 convolutionally encodes input data and outputs it. A mapping circuit 4 assigns input data to a BPSK, QPSK, or TC8PSK signal point according to the respective modulation methods, and outputs an I signal and a Q signal to a transmission line 5.

A decoder 6 receives the I signal and the Q signal; decodes it to one-bit data when the convolutionally encoded signals have been modulated by the BPSK or QPSK modulation method, and decodes it to two-bit data when the convolutionally encoded signals have been modulated by the TC8PSK modulation method; and outputs the data. A parallel-to-serial converter 7 outputs an input signal as it is when the input signal has been modulated by the BPSK or QPSK modulation method, and converts the two-bit parallel data to serial data and outputs it when the input signal has been modulated by the TC8PSK modulation method. A TMCC controller 8 controls the information generator 1 to the mapping circuit 4 by the use of the TMCC signal.

The information generator 1 will be further described by referring to FIG. 6. An information output circuit 21 sends the fixed information (TAB1 and TAB2 shown in FIG. 6) to an input terminal 11-1 and an input terminal 11-3 of a switching circuit 22, respectively; sends the TMCC signal (TMCC shown in FIG. 6) to an input terminal 11-2; and sends the main information (main information 0 to main information 47 shown in FIG. 6) to an input terminal 12-0 to an input terminal 12-47, respectively. The switching circuit 22 switches between the input terminals 11-1 to 11-3 and the input terminals 12-0 to 12-47 by a signal switcher 13 in a time-division manner, generates each serial data (TAB1, TMCC, TAB2, and main information 0 to main information 47), and outputs it to the serial-to-parallel converter 2.

FIG. 7 shows a frame structure of the data switched by the signal switcher 13 of the switching circuit 22. One superframe is formed of eight frames, a frame 0 to a frame 7. The frame 0 is formed of the fixed information TAB1, TMCC, the fixed information TAB2, and the main information 0 to the main information 47. A frame 1 to the frame 7 are formed in the similar way to the frame 0 except that the fixed information TAB2 in the frame 0 is replaced with fixed information TAB3. The fixed information TAB1, the fixed information TAB2, and the fixed information TAB3 have special patterns of 0x1B95, 0xA340, and 0x5CBF, respectively.

As the encoder 3, a trellis encoder which performs convolutional encoding will be described below by referring to FIG. 8. When a signal input from the serial-to-parallel converter 2 has been modulated by a modulation method other than the TC8PSK modulation method, an input bit (one bit) is input. When the input signal has been modulated by the TC8PSK modulation method, two bits, an input bit and a parallel bit, are input. In any of the modulation methods, the trellis encoder encodes an input bit at an encoding rate R of 1/2 and outputs an output bit 2 and an output bit 3. The parallel bit is not encoded and output as it is as an output bit 1. In other words, the trellis encoder encodes a two-bit input signal (input bit and parallel bit) at an encoding rate R of 2/3 to generate three bits.

The input bit is input to a delay circuit 31 formed of a register, an exclusive-OR circuit 33, and an exclusive-OR circuit 34. The delay circuit 31 delays the input input bit by a one-time-unit period, and outputs to a delay circuit 32 and the exclusive-OR circuit 33. The delay circuit 32 formed of a register delays the input input bit by a one-time-unit period and outputs to the exclusive-OR circuit 33 and the exclusive-OR circuit 34. The exclusive-OR circuit 33 calculates the exclusive OR of the input bit, the signal input from the delay circuit 31, and the signal input from the delay circuit 32, every one-time-unit period, and outputs the result as the output bit 2. The exclusive-OR circuit 34 calculates the exclusive OR of the input bit and the signal input from the delay circuit 32, every one-time-unit period, and outputs the result as the output bit 3.

The mapping circuit 4 maps the signal input from the encoder 3 onto signal points shown in FIG. 9 according to the signal modulation method. FIG. 9(A) shows signal-point arrangement for the signals (fixed information TAB1, fixed information TAB2, and TMCC signal) modulated by the BPSK modulation method. FIG. 9(B) shows signal-point arrangement for the signals (main information 0 to main information 47) modulated by the TC8PSK modulation method. These signal points indicate encoded transfer data which the mapping circuit 4 outputs. Two signal points (for example, a signal point (100) and a signal point (000)) positioned symmetrically against the center of the circle shown in FIG. 9(B) form a branch of the encoded transfer data. In a branch, one of the signal points has an MSB (most significant bit) of 1 (for example, the MSB of the signal point (100)) and the other has an MSB of 0 (for example, the MSB of the signal point (000)), and the signal points have the same bits (for example, the lower two bits, 00, of the signal point (100) and the signal point (000)) except the MSBs.

A Detailed structure of the decoder 6 will be described below by referring to FIG. 10. A branch-metric (hereinafter called BM) generator 41 calculates the square Euclidean distances of the received signals (I, Q) (corresponding to the I coordinate and the Q coordinate in the signal-point arrangement shown in FIG. 9) and the signal points (for example, the signal point (000) and the signal point (111) shown in FIG. 9(B)) of each branch, respectively, and outputs as four BM signals (BM00, BM01, BM10, and BM11). The BM generator 41 also outputs parallel-bit (hereinafter called PB) information (PB00, PB01, PB10, and PB11) selected correspondingly to each branch.

When a receiving point R (−0.173, 0.984) is received as a received signal modulated by the TC8PSK modulation method as shown in FIG. 11, for example, the square Euclidean distances (to say simply, the lengths of solid lines in FIG. 11) between the receiving point R, and the signal points (000) and (100) are calculated, and whichever shorter (in the case of FIG. 11, the distance between the receiving point R and the signal point (100) since the square Euclidean distance between the receiving point R and the signal point (100) is shorter than that between the receiving point R and the signal point (000)) is set in the BM signal BM00. The MSB (=1) of the signal point (100) used in the calculation of the BM signal BM00 is assigned to the PB information PB00 corresponding to the BM signal BM00. In the same way, the square Euclidean distances (the lengths of dotted lines in FIG. 11) between the receiving point R, and signal points (001) and (101) are calculated. In this case, the distance between the receiving point R and the signal point (001) is set to the BM signal BM01, and a value 0 (which is the MSB of the signal point (001)) is assigned to PB information PB01. BM signals BM10 and BM11, and PB information PB10 and PB11 are calculated in the same way. In other words, the BM generator 41 calculates branch metrics from the receiving point R corresponding to the received signal, and outputs BM signals and PB information used for decoding the signal points (transfer data) output from the mapping circuit 4.

When the receiving point R1 (−0.173, 0.984) of a signal modulated by the BPSK modulation method is received at a time t=t1 and a receiving point R2 (−0.173, −0.984) is received at a time t=t1+1, a BM signal BM00 is calculated by the following expression as shown in FIG. 12.

BM00=bm0(t1)+bm0(t1+1)

In this expression, bm0(t1) indicates the square Euclidean distance $(=(+1-(-0.173))^2)$ between the I component (=−0.173) of the receiving point R1 and the I component (=+1) of the signal point (0), and bm0(t1+1) indicates the square Euclidean distance $(=(+1-(-0.173))^2)$ between the I component (=−0.173) of the receiving point R2 and the I component (=+1) of the signal point (0). A BM signal BM01 is calculated by the following expression in the same way.

BM01=bm0(t1)+bm1(t1+1)

In this expression, bm0(t1) indicates the same value as that described above and therefore a description thereof is omitted, and bm1(t1+1) indicates the square Euclidean distance $(=(-1-(-0.173))^2)$ between the I component (=−0.173) of the receiving point R2 and the I component (=−1) of the signal point (1). The other BM signals are calculated by the following expressions in the same way.

BM10 bm1(t1)+bm0(t1+1)

BM11 bm1(t1)+bm1(t1+1)

Since a parallel bit has no meaning (since a parallel bit is not input to the encoder 3 for a signal modulated by the BPSK modulation method and therefore an indefinite value is output from the encoder, it has no meaning as data) in the BPSK modulation method, any values are assigned to PB information PB00 to PB11.

FIG. 13 shows the state transitions of the basic codes (which correspond to the bits excluding the MSB of signal points used for calculating a branch metric from a receiving point, and are 00, 01, 10, and 11) of a received signal. In other words, basic codes at a before-transition state and an after-transition state shown in FIG. 13 indicate the internal states of the encoder 3 (trellis encoder). A state 00 indicates that the delay circuit 31 and the delay circuit 32 shown in FIG. 8 hold a value 0 and a value 0, respectively, a state 01 indicates that they hold a value 0 and a value 1, respectively, a state 10 indicates that they hold a value 1 and a value 0, respectively, and a state 11 indicates that they hold a value 1 and a value 1, respectively. An arrow from each state before a transition to each state after the transition corresponds to a state transition. When a value 0 is input at the state 00 (corresponding to the values of the delay circuit 31 and the delay circuit 32), for-example, a value 00 (corresponding to the output bit 2 and the output bit 3) is output and the state is changed to a state 00 (corresponding to the values of the delay circuit 31 and the delay circuit 32). Therefore, a symbol 0/00 shown at I/O indicates an input of 0 and an output of 00. The other arrows and I/O's have the corresponding meanings in the same way.

The above state transition can be described in the following way by the operations of the encoder 3 shown in FIG. 8. When an input bit of 0 is input to the encoder 3 while the register of the delay circuit 31 has a value of 0 and the register of the delay circuit 32 has a value of 0 (state 00), the encoder 3 outputs an output bit 2 of 0 and an output bit 3 of 0 (output 00) as the calculation result. After the calculation, the register of the delay circuit 31 has a value of 0 and the register of the delay circuit 32 has a value of 0 (transition to state 00). In the same way, when a value of 1 is input at the state 00, a value of 11 is output and the state is changed to the state 10. When a value of 0 is input at the state 10, a value of 10 is output and the state is changed to the state 01. When a value of 1 is input at the state 10, a value of 01 is output and the state is changed to the state 11. The other state transitions can be calculated in the same way.

The values (corresponding to the values (SM00, SM0, SM10, and SM11) which registers 54A to 54D having resets shown in FIG. 14 have) of the state metrics (hereinafter called SMs) corresponding to state transitions from each state are calculated. A sicnal output when a state is changed correspond to a BM signal and PB information. Specifically, the output 00 corresponds to the BM signal BM00 and the PB information PB00, the output 01 corresponds to the BM signal BM01 and the PB information PB01, the output 10 corresponds to the BM signal BM10 and the PB information PB10, and the output 11 corresponds to the BM signal BM11 and the PB information PB11.

An ACS (add, compare, and select) circuit 42 receives the four pieces of PB information (PB00, PB01, PB10, and PB11) and the four BM signals (BM00, BM01, BM10, and BM11), and outputs PB information and path memory selection information (pb00, se100), (pb01, se101), (pb10, se110), and (pb11, se111). Details of the ACS circuit 42 will be described below by referring to a block diagram shown in FIG. 14.

An adder 51A adds the BM signal BM00 (BM value obtained when the state 00 is changed to the state 00) sent from the BM generator 41 to the value SM00 (the state metric value (hereinafter called SM value) at the state 00 before the transition) of the register 54A having a reset to calculate the likelihood (SM value) obtained when the state 00 is changed to the state 00. An adder 52A adds the BM signal BM11 (BM value obtained when the state 01 is changed to the state 00) sent from the BM generator 41 to the value SM01 (the SM value at the state 01 before the transition) of the register 54B having a reset to calculate the likelihood (SM value) obtained when the state 01 is changed to the state 00. At the initial state of decoding, the registers 54A to 54D having resets are reset to zero by reset signals output from a reset circuit (not shown).

After the transition, a comparator 53A compares the SM value obtained when the state 00 was changed to the state 00 with the SM value obtained when the state 01 was changed to the state 00, and selects whichever has a larger-likelihood path (SM value). When the SM value (the output of the adder 51A) obtained when the state 00 was changed to the state 00 is equal to or smaller than that the SM value (the output of the adder 52A) obtained when the state 01 was changed to the state 00, the comparator 53A outputs the smaller SM value (the output of the adder 51A) to the register 54A having a reset, and outputs to a path memory 43 a value of 0 as path-memory (hereinafter called PM) selection information se100 and PB00 corresponding to the selected SM value as the PB information pb00. Conversely, when the SM value (the output of the adder 51A) obtained when the state 00 was changed to the state 00 is larger that the SM value (the output of the adder 52A) obtained when the state 01 was changed to the state 00, the comparator 53A outputs the smaller SM value (the output of the adder 52A) to the register 54A having a reset, and outputs to the path memory 43 a value of 1 as the PM selection information se100 and PB11 corresponding to the selected SM value as the PB information pb00. The register 54A having a reset stores the SM value selected by the comparator 53A as a state metric at the state 00.

An adder 51B, an adder 52B, a comparator 53B, and the register 54B perform the same calculation as the adder 51A, the adder 52A, the comparator 53A, and the register 54A. The SM value (path likelihood) obtained when the state 10 or the state 11 is changed to the state 01 is calculated, and the PM selection information SE101 and the PB information pb01 are output to the path memory 43. As for a transition to the state 10 and that to the state 11, the same operation is performed. The BM generator 41 and the ACS circuit 42 perform the above processing every time a received signal (for example, the receiving point R shown in FIG. 11) is received.

The path memory 43 selects the maximum-likelihood path by the use of values (pb00, 0), (pb01, 0), (pb10, 1), and (pb11, 1) in which values 0, 0, 1, and 1 are combined with the PM selection information se100, se101, se11, and se111 and the PB information pb00, pb01, pb10, and pb11. Details of the path memory 43 will be described below by referring to a block diagram shown in FIG. 15. The relationship between a register and a selector in each column (for example, registers 63A to 63D and selectors 64A to 64D serving as register-output destinations) in the path memory 43 corresponds to the state transition shown in FIG. 13. Among registers in the first rows corresponding to the state 00, a register 61A in the first column stores the value (pb00, 0) corresponding to the PB information pb00 at the state 00 sent from the ACS circuit 42. A selector 62A selecting a path at the state 00 selects either the value (pb00, 0) sent from the first-column register 61A corresponding to the state 00 or the value (pb01, 0) sent from the first-column register 61B among registers in the second row corresponding to the state 01, according to the PM selection information se100; outputs it to a register 63A in the second column corresponding to the state 00; and stores in it.

The first-column register 61A stores a combination of the PB information pb00 (for example, PB00) obtained when the state is changed to the state 00 and input from the ACS circuit 42, and a value 0. The first-column register 61B in the second row stores a combination of the PB information pb01 (for example, PB10) obtained when the state is changed to the state 01 and input from the ACS circuit 42, and a value 0. The value of the register 61A and that of the register 61B are input to the selector 62A. The selector 62A corresponding to the state 00 outputs the value (pb00 (for example, the value of PB00, 0), 0) input from the register 61A to the second-column register 63A according to the PM selection information se100 (for example, a value 0 which specifies the selection from the state 00) input from the ACS circuit 42.

In the path memory 43, selections and transitions of combined values are performed according to the PM selection information for all columns (receiving-point count) and all states (state 00 to state 11), as described above. Finally, one of the combined value (the value stored in a register 76A) of the state 00 to the combined value (the value stored in a register 76D) of the state 11 is selected according to information "smmin" indicating the minimum state-metric value as the combined value of the maximum-likelihood state in a selector 77. The selected combined value is output.

Path selection processing is applied to data input at a point of time by the number (the number of received signals) of the columns of the path memory 43. This means that data input at a point of time is affected by data input thereafter, is delayed by the number (the number of received signals) of the columns of the path memory 43, and is output.

When the modulation method is changed from the BPSK method to the PC8PSK method at a time "t," for example, data conforming to the BPSK modulation method is input at a time (t−1) and a branch metric is calculated. Then, in the ACS circuit 42, path-selection information is calculated according to the result of the branch-metric calculation. Path-memory selection processing is performed in the path memory 43.

Until the output corresponding to the data input at the time (t−1) is obtained, however, the data of the BPSK modulation method is affected by data which is modulated by the TC8PSK modulation method and input after the time "t." Since the branch metric corresponding to data modulated by the TC8PSK modulation method has a relatively low reliability of likelihood than the branch metric corresponding to the data modulated by the BPSK modulation method, the reliability of the path-selection information corresponding to the data modulated by the TC8PSK modulation method is also lower. As a result, although transfer is performed by the BPSK modulation method to increase reliability, since the transfer method is changed to the TC8PSK modulation method, an error characteristic deteriorates at a point where the transfer method is changed.

DISCLOSURE OF THE INVENTION

The present invention has been made in consideration of the above situation. Accordingly, it is an object of the present invention to detect the position of fixed information in transferred data convolutionally encoded, to determine whether a code transition state is terminated, and to control the value of a state metric, such that the deterioration of an error characteristic in decoding the transfer data is suppressed when the transfer-data modulation method is changed.

In order to solve the above problem, in the present invention, a decoding apparatus for decoding transfer data in which main information and fixed information are convolutionally encoded includes: a generation means for generating the branch metric corresponding to the transition state of the code of the convolutionally encoded transfer data; a selection means for calculating a state metric according to the branch metric and for selecting the path of the code; a detection means for detecting the position of the fixed information in the transfer data; a control means for controlling the value of the state metric of the fixed information correspondingly to a detection result obtained by the detection means; and a storage means for storing the selection state of the path of the code according to the selection of the path.

Further, a decoding method for decoding transfer data in which main information and fixed information are convolutionally encoded includes: a generation step of generating the branch metric corresponding to the transition state of the code of the convolutionally encoded transfer data; a selection step of calculating a state metric according to the branch metric and of selecting the path of the code; a detection step of detecting the position of the fixed information in the transfer data; a control step of controlling the value of the state metric of the fixed information correspondingly to a detection result obtained in the detection step; and a storage step of storing the selection state of the path of the code according to the selection of the path.

BEST MODE FOR CARRYING OUT THE INVENTION

Figure 5:
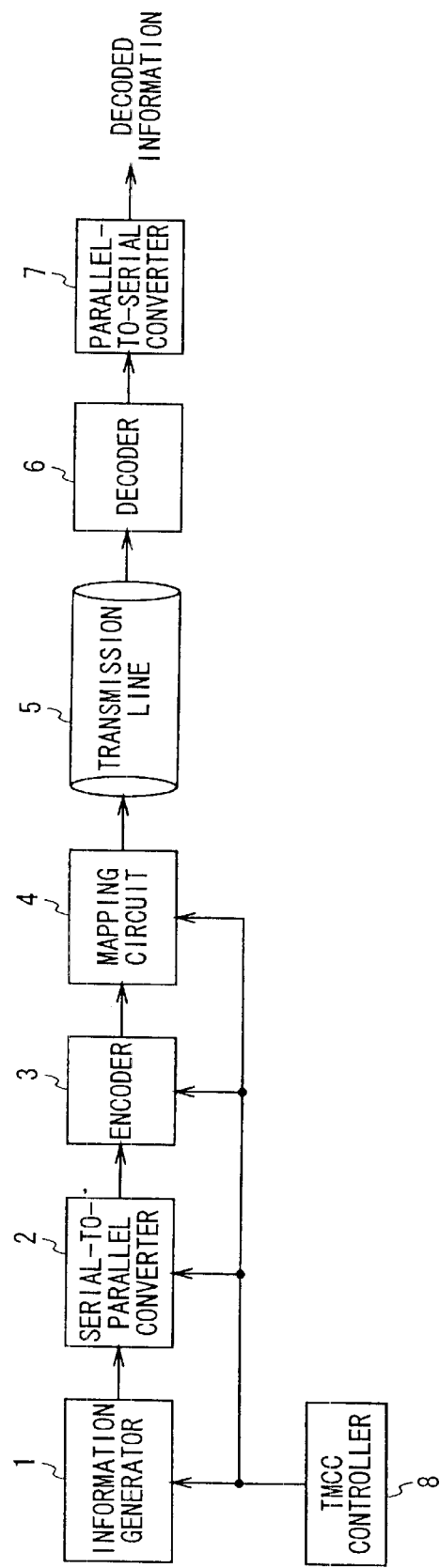
FIG. 5 is a block diagram showing a transfer system in which a signal is encoded, transferred, and decoded.
Figure 6:
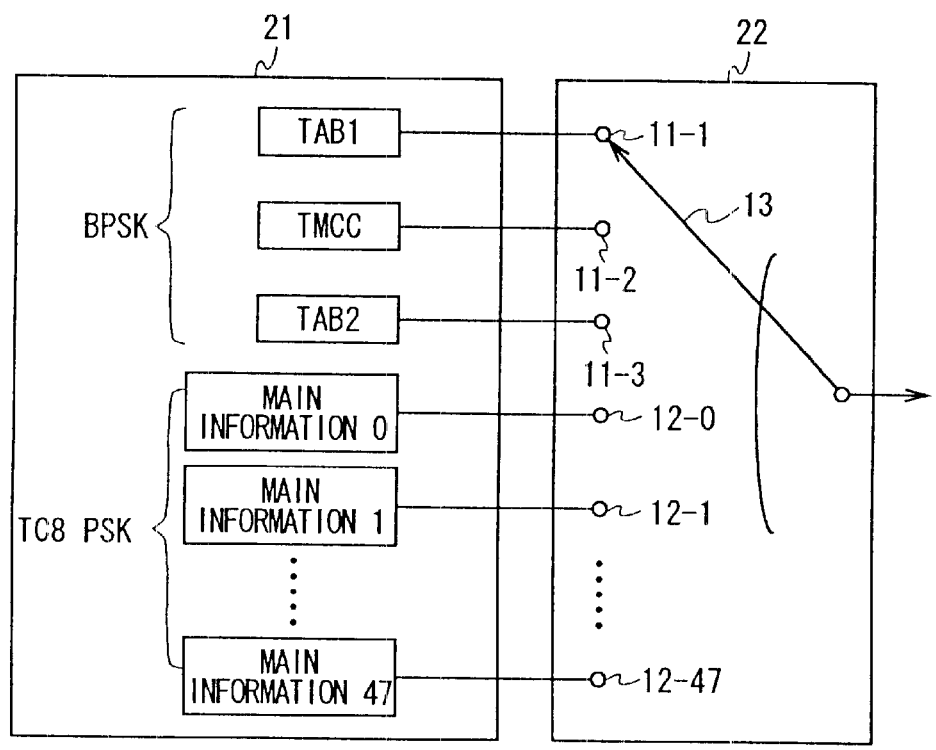
FIG. 6 is a block diagram showing details of a structure of an information generator 1 shown in FIG. 5.

The present invention will be described below. Since the fundamental structure of a system formed of an encoding apparatus and a decoding apparatus according to the present invention is the same as in a case shown in FIG. 5, the corresponding symbols are used in the following description.

Figure 7:
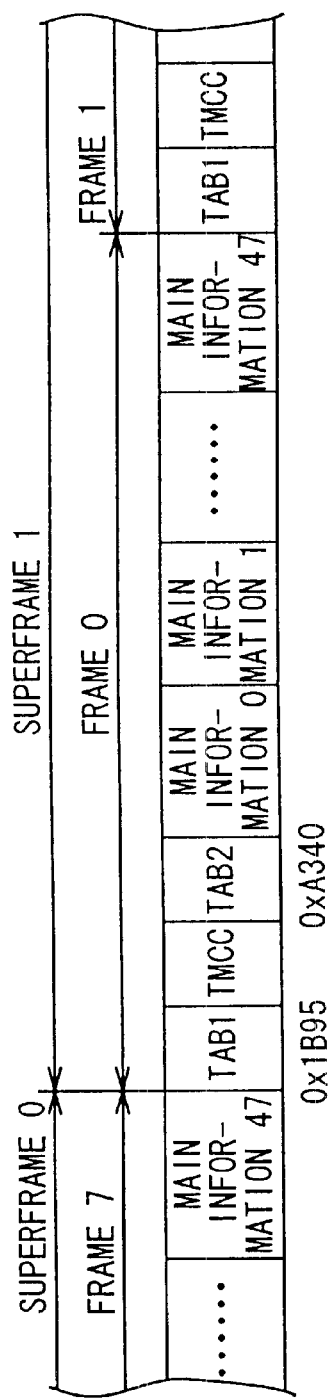
FIG. 7 is a view showing the frame state of a signal output from a switching circuit 22 shown in FIG. 6.
Figure 8:
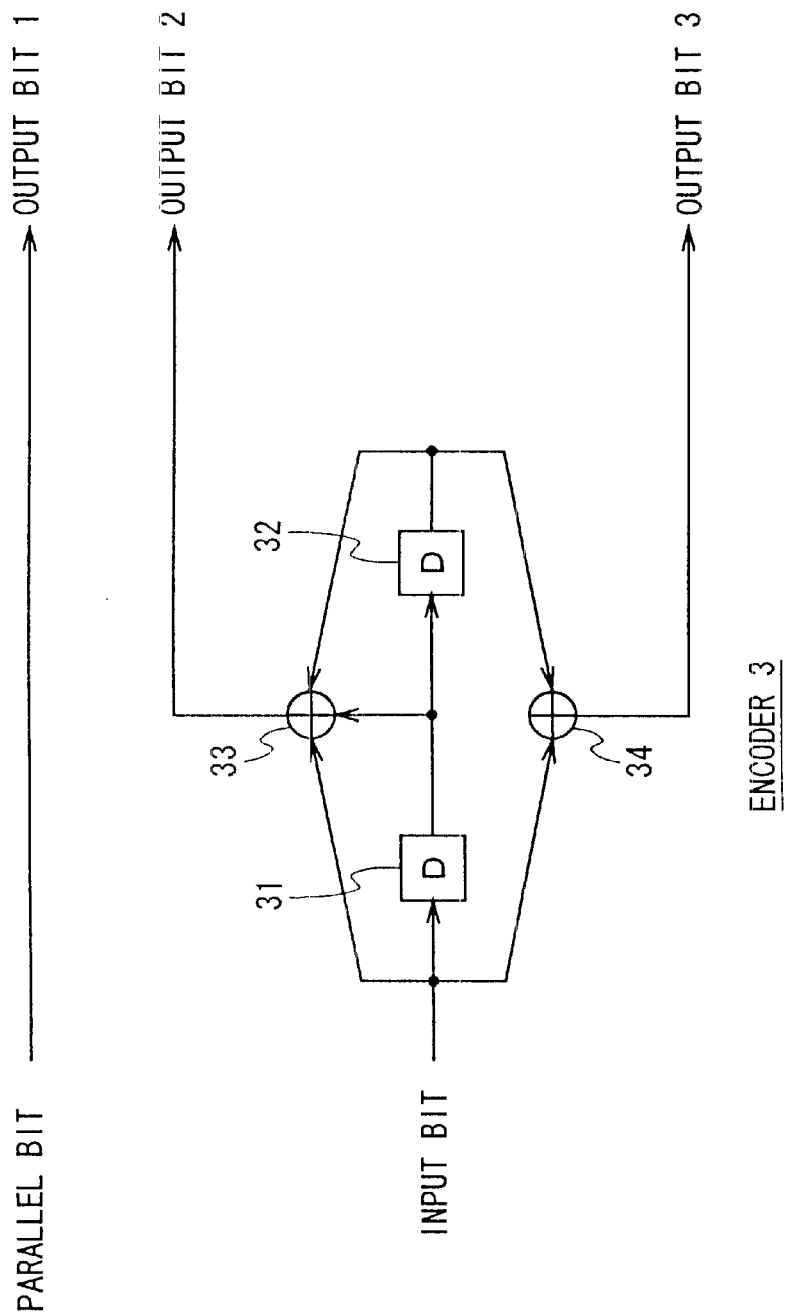
FIG. 8 is a block diagram showing a detailed structure of the encoder 3 shown in FIG. 5.
Figure 9:
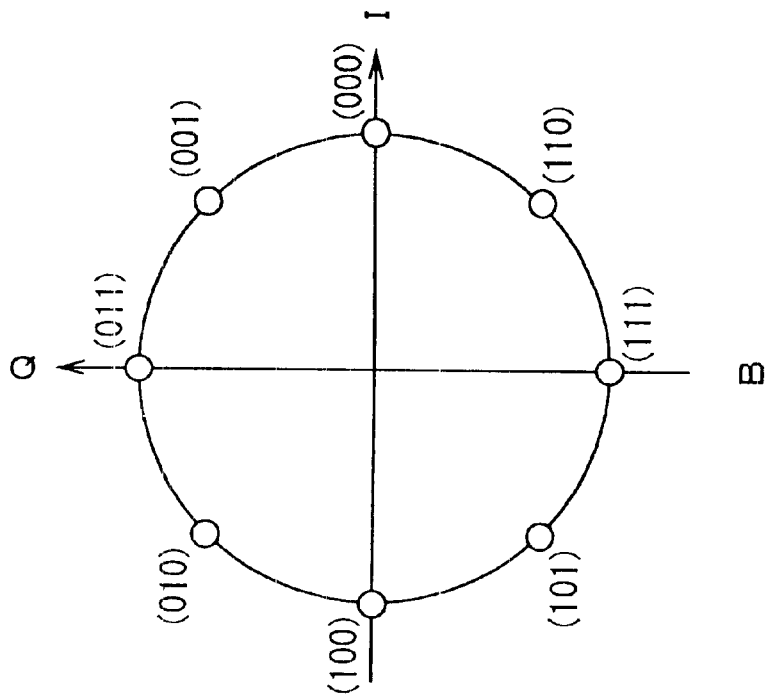
FIG. 9 is a view showing signal points on which signals are mapped in a mapping circuit 4 shown in FIG. 5.
Figure 9:
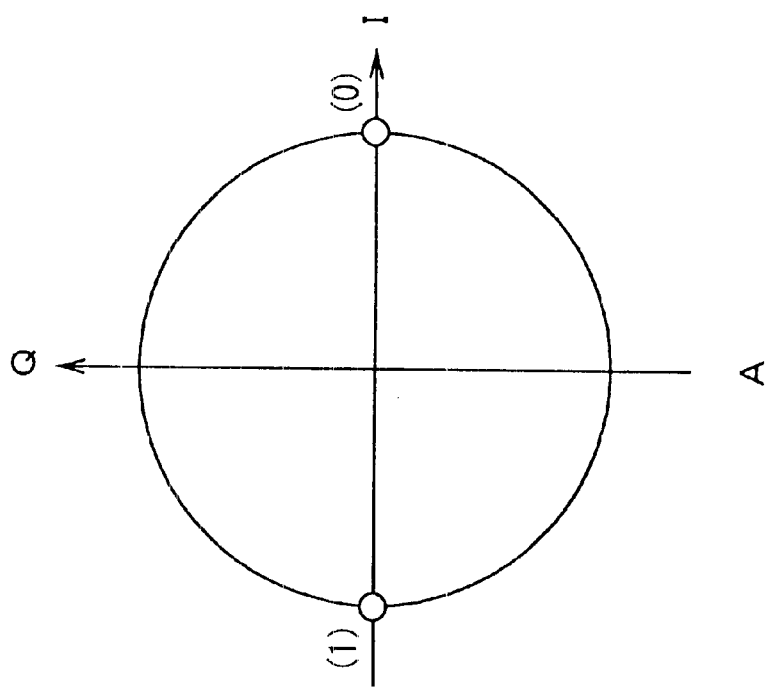
Figure 10:
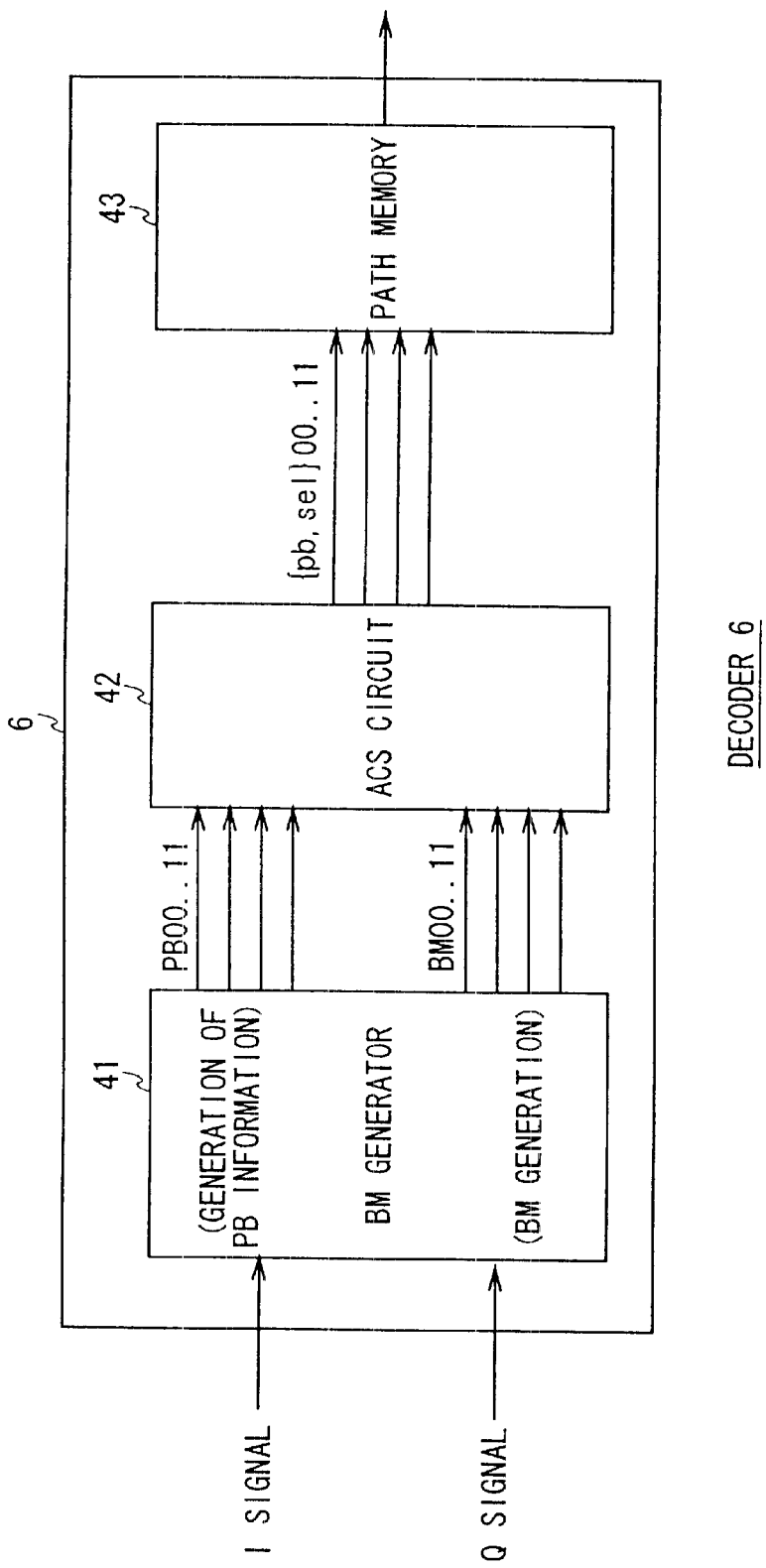
FIG. 10 is a block diagram showing a detailed structure of a decoder 6 shown in FIG. 5.
Figure 11:
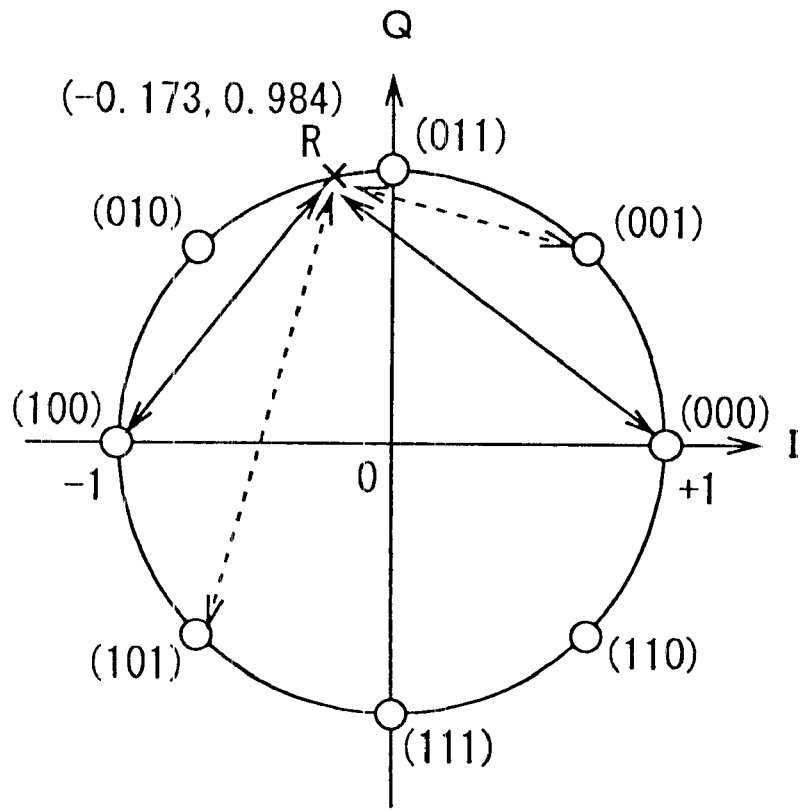
FIG. 11 is a view showing a branch metric obtained when a BM generator 41 shown in FIG. 10 generates a BM signal.
Figure 12:
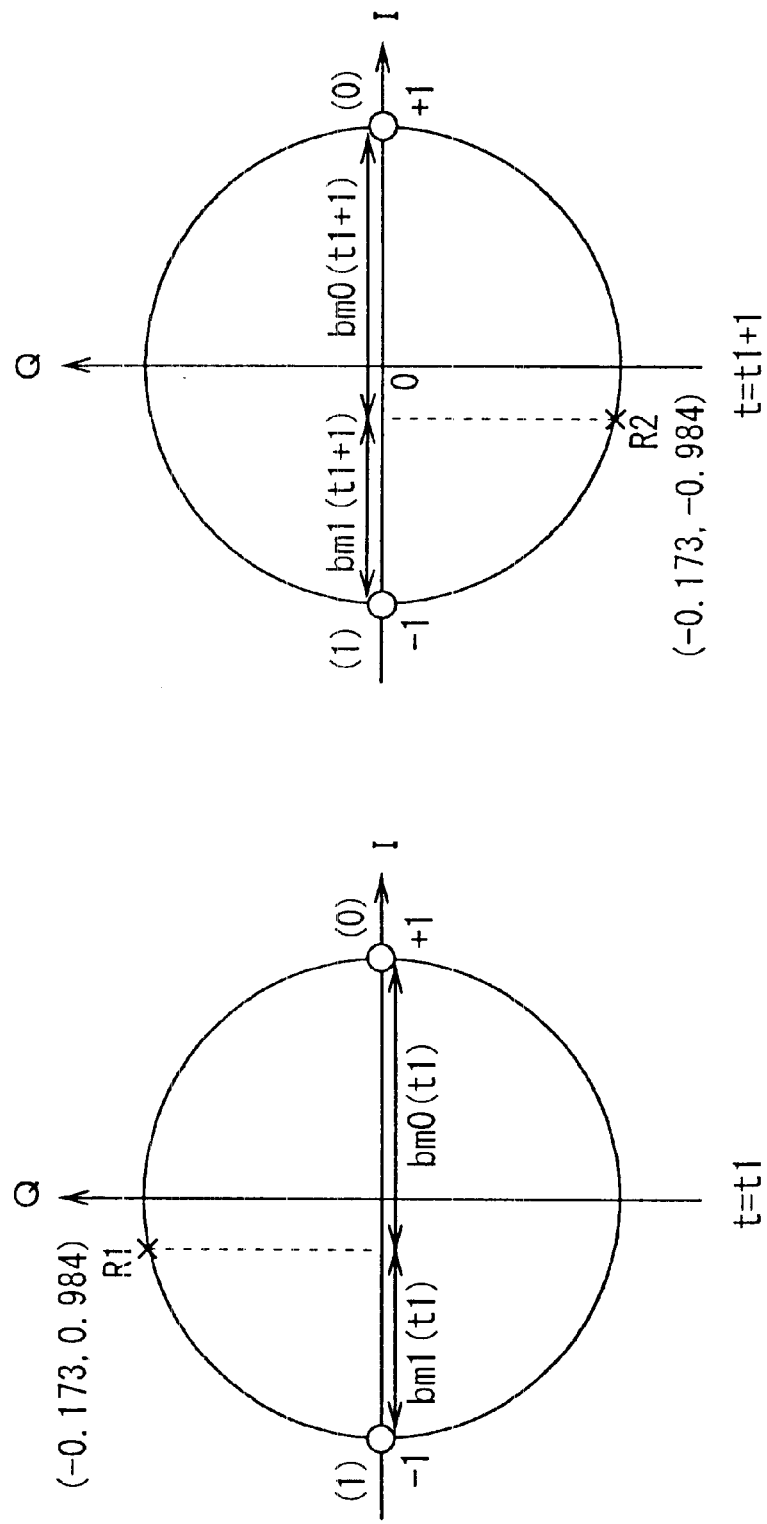
FIG. 12 is a view showing a branch metric obtained when a BM generator 41 shown in FIG. 10 generates a BM signal.

In the superframe 1 shown in FIG. 7, since the fixed information TAB1 and the fixed information TAB2 are 16-bit signals having the special patterns specified in advance, when the first two bits of each fixed information are input to the encoder 3 shown in FIG. 8, the internal state of the encoder 3 is uniquely determined. Specifically, until the first two bits of the fixed information TAB1 are input, for example, since the output of the encoder 3 is determined by the data of main information 47 in a frame 7 of the superframe 0, which is a signal having no special pattern and stored in the delay circuit 32, the output is not uniquely determined. When the remaining 16 bits, starting with the third bit, are continuously input, the output of the encoder 3 is uniquely determined. In the present invention, such a condition is regarded as the termination of convolutional codes (trellis codes), and the decoder performs the corresponding processing (hereinafter called termination processing) to suppress the deterioration of an error characteristic at a point where the transfer method is changed.

Figure 1:
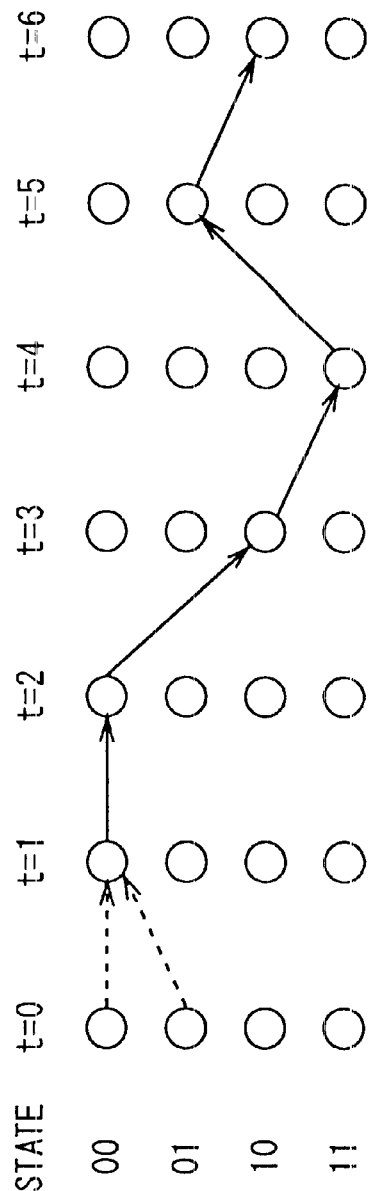
FIG. 1 is a trellis diagram indicating the state transition of fixed information TAB1.

FIG. 1 is a trellis diagram indicating the state transitions of basic codes, obtained when the fixed information TAB1 is input to the decoder 6. It is assumed that a time t=0 corresponds to timing when the first bit of the fixed information TAB1 is input to the encoder 3. The state of the encoder 3 at that time is determined by the information bit (the last bit of the data of the main information 47 in the frame 7 of the superframe 0) immediately before the fixed information TAB1 and the first bit of the fixed information TAB1. Since the information bit immediately before the fixed information TAB1 can be any value, it is not determined whether the state of the encoder 3 is the state 00 or the state 01. At timing when the second bit of the data (0x1B95="0001 1011 1001 0101") of the fixed information TAB1 is input at a time t=1, the state of the fixed information is uniquely determined to be the state 00. The state is uniquely changed whenever a bit of the data of the fixed information TAB1 is input as shown in FIG. 1.

The decoder 6 determines that the convolutional codes of the fixed information is terminated when the state of the input fixed information is uniquely determined, and performs the termination processing corresponding thereto.

Figure 2:
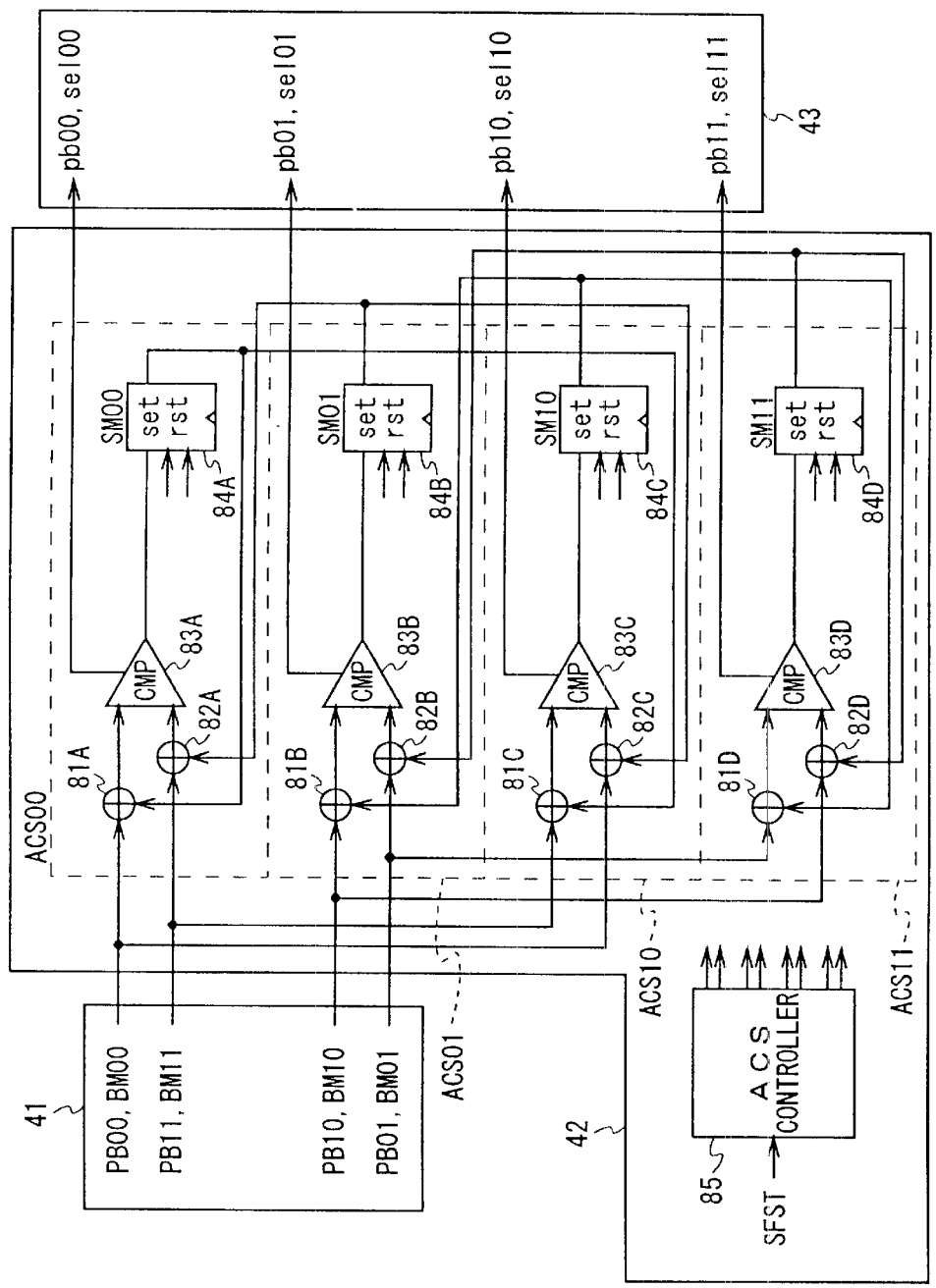
FIG. 2 is a block diagram showing an example structure of an ACS circuit 42 to which the present invention is applied.
Figure 14:
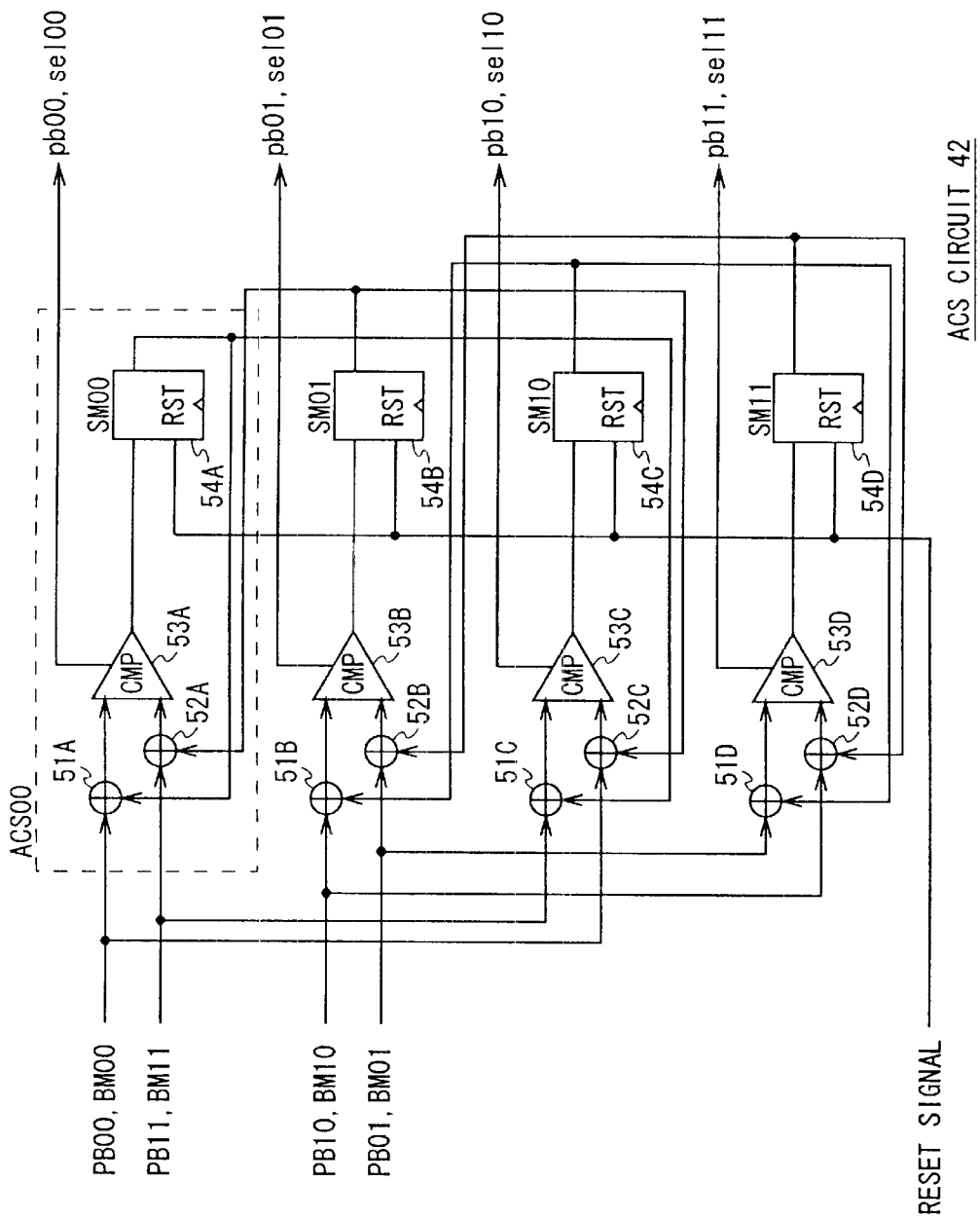
FIG. 14 is a block diagram showing a detailed structure of an ACS circuit 42 shown in FIG. 10.
Figure 15:
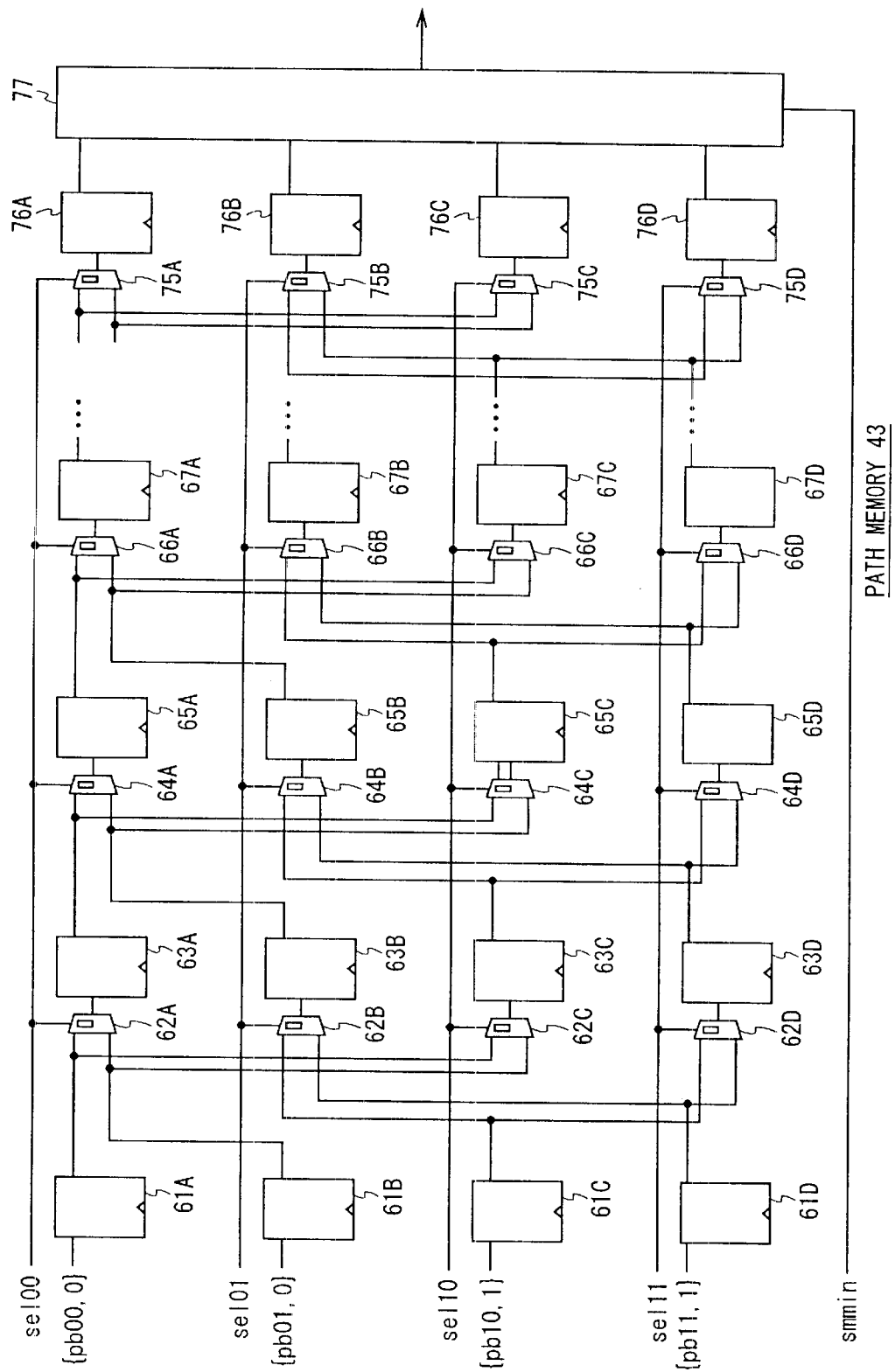
FIG. 15 is a block diagram showing a detailed structure of a path memory 43 shown in FIG. 10.

To perform the termination processing, an ACS circuit 42 according to the present invention is configured as shown in FIG. 2. In a decoder 6, a BM generator 41 and a path memory 43 can have the same structures as those in the conventional case. In the ACS circuit 42 shown in FIG. 2, since an adder 81A, an adder 82A, and a comparator 83A have the same structures as the adder 51A, the adder 52A, and the comparator 53A in the ACS circuit 42 shown in FIG. 14, descriptions thereof will be omitted.

A register 84A having a set and a reset stores the SM value of the state 00, selected by the comparator 83A. A register 84B having a set and a reset stores the SM value of the state 01, selected by the comparator 83B. A register 84C having a set and a reset stores the SM value of the state 10, selected by the comparator 83C. A register 84D having a set and a reset stores the SM value of the state 11, selected by the comparator 83D. An ACS controller 85 outputs signals for controlling the values of the registers 84A to 84D having sets and resets.

The operation of the ACS circuit 42 will be described next. At the initial state of decoding, the ACS controller 85 outputs reset signals to the registers 84A to 84D having sets and resets to set the values of the registers to zero. When a signal SFST indicating the position of the top of a superframe is input, the ACS controller 85 understands the position of the superframe, and with the position thereof being used as the reference, the positions of the fixed information TAB1 and the fixed information TAB2.

When data (second bit) of the fixed information TAB1 is input to the encoder 3 at the time t=1 shown in FIG. 1, for example, since the internal state of the encoder 3 is set to the state 00, if the corresponding data (BM signal and PB information at the time t=1) is input to the ACS circuit 42, the ACS controller 85 performs the termination processing.

In a circuit ACS00 which corresponds to the state 00 of the ACS circuit 42 at the time t=1, the adder 81A adds the BM signal BM00 (BM value obtained when the state 00 is changed to the state 00) sent from the BM generator 41 to the value (which has been set to zero by the ACS controller 85) of the register 84A having a reset (to calculate the SM value obtained when the state 00 is changed to the state 00 at the time t=1), and outputs it to the comparator 83A. The adder 82A adds the BM signal BM11 (BM value obtained when the state 01 is changed to the state 00) sent from the BM generator 41 to the value (which has been set to zero by the ACS controller 85) of the register 84B having a reset (to calculate the SM value obtained when the state 01 is changed to the state 00 at the time t=1), and outputs it to the comparator 83A.

The comparator 83A compares the SM value obtained when the state 00 was changed to the state 00 with the SM value obtained when the state 01 was changed to the state 00, and selects whichever has a larger-likelihood path (SM value). More specifically, when the SM value (the output of the adder 81A) obtained when the state 00 was changed to the state 00 is equal to or smaller that the SM value (the output of the adder 82A) obtained when the state 01 was changed to the state 00, the comparator 83A outputs the smaller SM value (the output of the adder 81A) to the register 84A having a reset, and outputs to a path memory 43 a value of 0 as the PM selection information se100 and PB00 corresponding to the selected SM value as the PB information pb00.

Conversely, when the SM value (the output of the adder 81A) obtained when the state 00 was changed to the state 00 is larger that the SM value (the output of the adder 82A) obtained when the state 01 was changed to the state 00, the comparator 83A outputs the smaller SM value (the output of the adder 82A) to the register 84A having a reset, and outputs to the path memory 43 a value of 1 as the PM selection information se100 and PB11 corresponding to the selected SM value as the PB information pb00. A circuit ACS01 which performs calculation when the state is changed to the state 01 of the ACS circuit 42, a circuit ACS10 which performs calculation (calculation of an SM value, generation of PM selection information, and selection of PB information) when the state is changed to the state 10, and a circuit ACS11 which performs calculation (calculation of an SM value, generation of PM selection information, and selection of PB information) when the state is changed to the state 11 execute the same calculation as the circuit ACS00.

The circuit ACS00 of the ACS circuit 42 executes calculation for the state 00, which is a uniquely determined state of the fixed information TAB1 at the time t=1. In this case, the ACS controller 85 outputs a reset signal to the register 84A having a set and a reset to set the value of the register to zero. In other words, the SM value calculated at the time t=1 in the state 00 is changed to the value 0. This SM value is to be used as the value of the register 84A having a set and a reset in the state 00 at a time t=2.

The circuit ACS01, which performs calculation (calculation of an SM value, generation of PM selection information, and selection of PB information) when the state is changed to the state 01 of the ACS circuit 42, has not executed calculation (at the time t=1, the state was not changed to the state 01) for the state 00, which is a uniquely determined state of the fixed information TAB1 at the time t=1. The ACS controller 85 outputs a set signal to the register 84B having a set and a reset which stores the SM value of the state 01 to set the value of the register to the maximum value. In other words, in the circuit ACS01 in the state 01, the SM value (the value of the register 84B having a set and a reset) calculated at the time t=1 is changed to the maximum value. This SM value is to be used as the value of the register 84B having a set and a reset in the state 01 at the time t=2. The ACS controller 85 applies the same processing (for setting the values of the registers 84C and 84D having sets and resets to the maximum value) as that for the circuit ACS01, to the circuit ACS10, which performs calculation (calculation of an SM value, generation of PM selection information, and selection of PB information) when the state is changed to the state 10 at the time t=1, and the circuit ACS11, which performs calculation (calculation of an SM value, generation of PM selection information, and selection of PB information) when the state is changed to the state 11.

As described above, in the termination processing, the value of the register having a set and a reset which has calculated the SM value of the uniquely determined state is changed to zero, and the values of the registers having sets and resets which have calculated the SM values of other states are changed to the maximum value. These changed values of the registers having sets and resets are used when the next data is input, and make the SM value of a selected path the minimum and the SM values of not-selected paths the maximum. Therefore, it is advantageous that, with a comparison of SM values, a path selection state becomes clear.

It is desirable that the maximum value of the state metric be larger than twice the maximum value (constraint length K (=3)−1=2) of the branch metric. With a trade-off between a hardware structure and the amount of deterioration in an error-correcting capability being taken into account, the maximum value may be not necessarily larger than the maximum value of the branch metric.

In the same way, at the time t=2, since the internal state of the encoder 3 becomes the state 00, the ACS controller 85 sets the SM value SM00 (the value of the register 84A having a set and a reset) of the state 00 to zero; and the SM value SM01 (the value of the register 84B having a set and a reset) of the state 01, the SM value SM10 (the value of the register 84C having a set and a reset) of the state 10, and the SM value SM11 (the value of the register 84D having a set and a reset) of the state 11 to the maximum value. At a time t=3, since the internal state of the encoder 3 becomes the state 10, the SM value SM10 of the state 10 is set to zero; and the SM value SM00 of the state 00, the SM value SM01 of the state 01, and the SM value SM11 of the state 11 are set to the maximum value.

Figure 13:
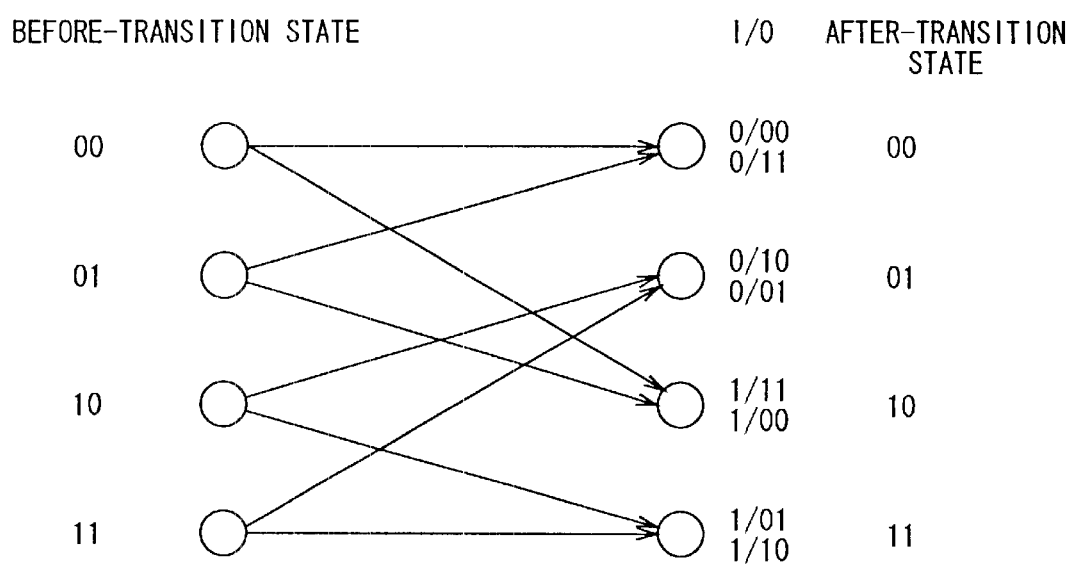
FIG. 13 is a view showing the transition states of signals in the encoder 3 shown in FIG. 5.

The above termination processing is executed until the value 1 (the value of the last bit of the special-pattern value 1B95 of the fixed information TAB1 shown in FIG. 1) of the last bit of the fixed information TAB1, which corresponds to a time t=15, is input. Since a signal received at a time t=16 is a TMCC signal, the termination processing is not performed but the same ACS processing as for the conventional ACS circuit 42 (the ACS circuit 42 shown in FIG. 13) is performed.

Since the fixed information TAB2 is fixed data (of 0xA340="1010 0011 0100 0000"), the above termination processing is executed according to the uniquely determined state transition in the same way as for the fixed information TAB1, from processing for the received signal corresponding to the second bit of the data of the fixed information TAB2 to processing for the received signal corresponding to the 16th bit of the data of the fixed information TAB2. The same processing as for the conventional ACS circuit 42 is applied to data positioned after the data of the fixed information TAB2 because it is the data of the main information 0.

The above-described ACS circuit 42 applies the termination processing to all of the data of the fixed information TAB1 and the fixed information TAB2. The same advantage is obtained if the termination processing is applied to a part of the data of the fixed information.

With the fixed information TAB1 being taken as an example, the state of the fixed information TAB1 is uniquely determined to be the state 00 only when the first bit of the data of the fixed information TAB1 is input at the time t=0 and then the second bit of the data of the fixed information TAB1 is input at the time t=1 in FIG. 1. The ACS circuit 42 does not perform the termination processing at the time t=1 but executes it at the time t=15 (when the 16th bit of the data of the fixed information TAB1 is input). Since the state is changed to the state 10 (as shown in FIG. 8, a new bit in the LSB side is indicated at the left) at the time t=15, the ACS controller 85 sets the SM value SM10 of the state 10 to zero, and the SM value SM00 of the state 00, the SM value SM01 of the state 01, and the SM value SM11 of the state 11 to the maximum value (the same as the above-described maximum value). The ACS circuit 42 executes the same processing (the termination processing is not performed) as the conventional ACS circuit 42 at the time t=16 since a TMCC signal is input. In other words, the termination processing is executed immediately before the type of the signal is changed, and thereby, the same advantage as that obtained when the termination processing is applied to all data is obtained.

As for the fixed information TAB2, the above-described advantage is obtained if the termination processing is executed immediately after the type of the signal is changed, namely, only when the second bit of the fixed information TAB2 is input. When the first bit of the fixed information TAB2 is input, since the state is not uniquely determined, it is not appropriate that the termination processing is executed at that timing.

As an ACS circuit for executing the termination processing when the type of the signal is changed, the ACS circuit 42 can be used as it is. The ACS controller 85 outputs a reset signal to an appropriate register having a set and a reset (in the termination processing for the data of the fixed information TAB1, for example, the register 84C having a set and a reset corresponding to the state 10 at the time t=15) only when the timing for the termination processing is detected by the SFST signal, and outputs set signals to appropriate registers having sets and resets (in the termination processing for the data of the fixed information TAB1, for example, the registers 84A, 84B, and 84C having sets and resets, at the time t=15).

Figure 3:
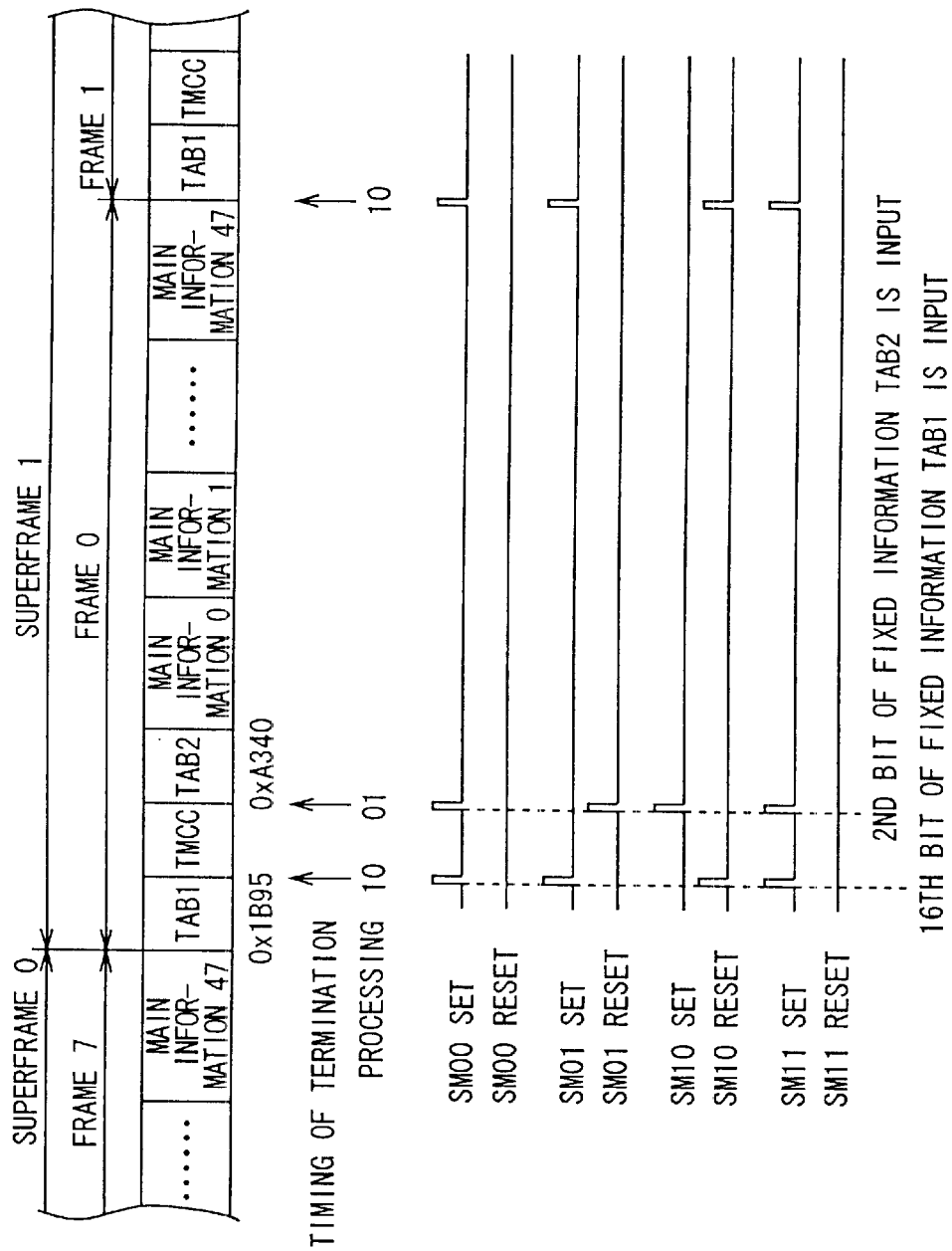
FIG. 3 is a view illustrating an example of timing when the ACS circuit 42 shown in FIG. 2 executes termination processing.

FIG. 3 indicates timing when the ACS controller 85 outputs set signals and reset signals to registers having sets and resets. When the 16th bit of the fixed information TAB1 is input at the time t=15, the ACS controller 85 outputs a reset signal to the register 84C having a set and a reset, which stores the SM value SM10 of the state 10 at that time, and outputs set signals to registers having sets and resets, which store the state metric values of the other states, the register 84A (which stores the SM value SM00), the register 84B (which stores the SM value SM 01), and the register 84D (which stores the SM value SM 11). When the second bit of the fixed information TAB2 is input, the ACS controller 85 outputs a reset signal to the register 84B having a set and a reset, which stores the SM value SM01 of the state 01 at that time, and outputs set signals to registers having sets and resets, which store the state metric values of the other states, the register 84A (which stores the SM value SM00), the register 84C (which stores the SM value SM 10), and the register 84D (which stores the SM value SM 11).

In the BS broadcasting system, if the termination processing is executed when the type of the signal is changed (for example, the signal is changed from the fixed information TAB1 to the TMCC signal, or from the TMCC signal to the fixed information TAB), since the TMCC signal used for informing the transfer method is not affected by the previous and following signals (fixed information TAB1 and TAB2) which have a different signal type, an error characteristic is improved.

Within the period (time t=1 to time t=15 in FIG. 1) in which the state transition is uniquely determined against the input of fixed information, with a trade-off between the error correcting capability and processing resource of the decoder 6 being taken into account, the timing and the frequency of the termination processing can be those other than those described before. For example, the termination processing can be executed only when the seventh bits of the fixed information TAB1 and the fixed information TAB2 are input. Since both states of the fixed information TAB1 and TAB2 are the state 10 at this timing, the ACS controller 85 can use the same output timing of set signals and reset signals and the same maximum value for both fixed information TAB1 and fixed information TAB2. Therefore, the circuit structure can be simplified. The timing is not limited to that when the seventh bits of the fixed information TAB1 and TAB2 are input, and may be that when both have the same state.

The termination processing does not necessarily need to be executed for both fixed information TAB1 and fixed information TAB2. The termination processing may be executed for either timing (when the signal is changed, for example, timing when the last bit of the fixed information TAB1 is input or timing when the second bit of the fixed information TAB2 is input).

Figure 4:
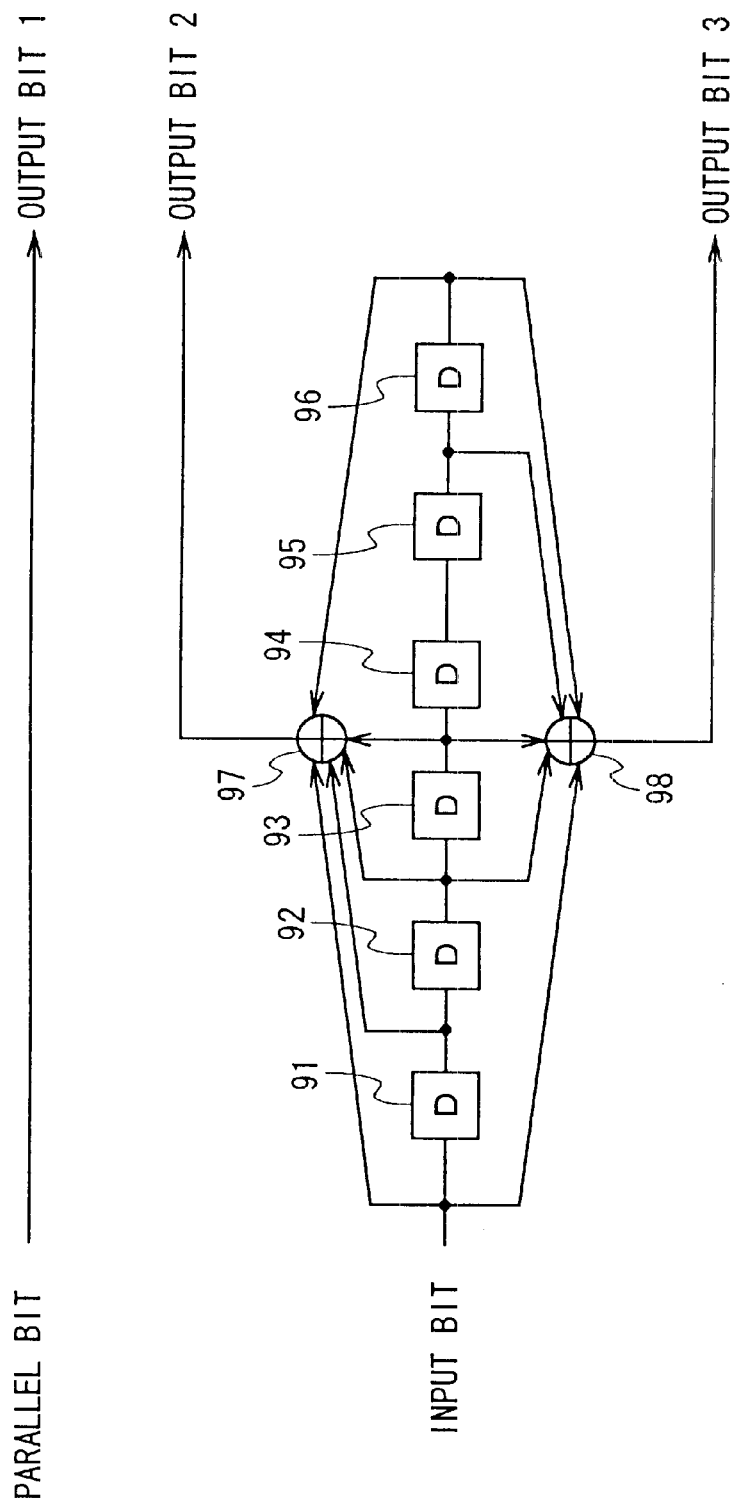
FIG. 4 is a block diagram showing another example structure of an encoder 3.

The encoder (trellis encoder) 3 shown in FIG. 8 has been simplified for the convenience of the description. FIG. 4 shows a structure of an encoder (trellis encoder) 3 actually employed by the Japanese BS digital broadcasting method. In this trellis encoder, in the same way as in the encoder 3 shown in FIG. 8, an input bit and a parallel bit are input, the input bit is encoded at an encoding rate R of 1/2, the parallel bit is not encoded but output as it is, and the encoding rate R of the entire encoder is 2/3.

Since the trellis encoder has a constraint length K of 7 in encoding an input bit, six delay circuits (a delay circuit 91 to a delay circuit 96) formed of registers are provided. Each of the delay circuit 91 to the delay circuit 96 delays an input bit by a one-time-unit period and outputs it. An exclusive-OR circuit 97 calculates the exclusive OR of the input bit, the output signal of the delay circuit 91, the output signal of the delay circuit 92, the output signal of the delay circuit 93, and the output signal of the delay circuit 96, and outputs an output bit 2. An exclusive-OR circuit 98 calculates the exclusive OR of the input bit, the output signal of the delay circuit 92, the output signal of the delay circuit 93, the output signal of the delay circuit 95, and the output signal of the delay circuit 96, and outputs an output bit 3.

Since this trellis encoder has a constraint length K of 7, 64 ($=2^7$) internal states exist. When the sixth bit of input data is stored (when the seventh bit is input), the state-transition state of fixed information is uniquely determined. A decoder corresponding to this trellis encoder can be structured by extending the number of the internal states to 64. The operation of the decoder is also the same, the description of the decoder will be omitted.

In the present specification, information providing media for providing the user with a computer program which executes the above processing include transfer media, such as Internet and digital satellites, in addition to information recording media, such as magnetic disks and CD-ROMs.

According to the decoding apparatus as described above, the position of the fixed information in the convolutionally encoded transfer data is detected, and the state-metric value of the fixed information is controlled when the transition state of the code of the fixed information is terminated. Therefore, the deterioration of an error characteristic in decoding obtained when the transfer-data modulation method is changed is suppressed with a very simple circuit structure, and the circuit is made compact and needs less power.

Industrial Applicability

The present invention is utilized for a digital broadcasting system, for example, a digital broadcasting service using a broadcasting satellite.

What is claimed is:

1. A decoding apparatus for decoding transfer data in which main information and fixed information are convolutionally encoded, comprising:

generation means for generating a branch metric corresponding to a transition state of a code of the convolutionally encoded transfer data;

selection means for calculating a state metric according to said branch metric and for selecting a path for said code;

detection means for detecting a position of said fixed information in said transfer data;

control means for controlling a value of said state metric of said fixed information corresponding to a detection result obtained by said detection means; and storage means for storing a selection state of said path of said code based on the selection of the path.

2. The decoding apparatus according to claim 1, wherein said control means controls values of state metrics of all of the fixed information after a transition of the code of the fixed information is terminated.

3. The decoding apparatus according to claim 1, wherein said control means controls the value of the state metric of the fixed information positioned at an arbitrary location after a transition of the code of the fixed information is terminated.

4. The decoding apparatus according to claim 1, wherein said control means controls values of state metrics of the fixed information positioned at a plurality of locations after a transition of the code of the fixed information is terminated.

5. The decoding apparatus according to claim 1, wherein when states of codes of a plurality of the fixed information obtained after a transition of the codes of the plurality of the fixed information is terminated are the same, said control means controls the value of the state metric at one location corresponding to each of the plurality of the fixed information.

6. A decoding method for a decoding apparatus which decodes transfer data in which main information and fixed information are convolutionally encoded, comprising the steps of:

generating a branch metric corresponding to a transition state of a code of the convolutionally encoded transfer data;

calculating a state metric according to said branch metric selecting a path for said code;

detecting a position of said fixed information in the transfer data;

controlling a value of said state metric of said fixed information corresponding to a detection result obtained in said detection step; and storing the selection state of said path of said code based on the selection of the path.

7. The decoding method according to claim 6, wherein said control step controls values of state metrics of all the fixed information after a transition of the codes of the fixed information is terminated.

8. The decoding method according to claim 6, wherein said control step controls the value of the state metric of the fixed information positioned at an arbitrary location after a transition of the code of the fixed information is terminated.

9. The decoding method according to claim 6, wherein said control step controls values of state metrics of the fixed information positioned at a plurality of arbitrary locations after a transition of the code of the fixed information is terminated.

10. The decoding method according to claim 6, wherein when states of codes of a plurality of the fixed information obtained after a transition of codes of the plurality of the fixed information is terminated are the same, said control step controls the value of the state metric at one location corresponding to each of the plurality of the fixed information.

* * * * *